United States Patent
Lo et al.

(10) Patent No.: US 6,391,758 B1
(45) Date of Patent: May 21, 2002

(54) METHOD OF FORMING SOLDER AREAS OVER A LEAD FRAME

(75) Inventors: Randy H. Y. Lo, Taipei; Jui-Meng Jao, Miaoli, both of (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/525,717

(22) Filed: Mar. 14, 2000

(51) Int. Cl.⁷ ................................................ H01L 21/44
(52) U.S. Cl. ........................ 438/612; 438/613; 438/614; 438/652; 438/677
(58) Field of Search ................................ 438/612, 613, 438/614, 652, 677

(56) References Cited

U.S. PATENT DOCUMENTS

| | | | | |
|---|---|---|---|---|
| 5,565,378 A | * | 10/1996 | Harada et al. | 438/106 |
| 5,661,082 A | * | 8/1997 | Hsu et al. | 438/612 |
| 5,847,455 A | | 12/1998 | Manteghi | |
| 5,885,891 A | * | 3/1999 | Miyata et al. | 438/612 |

* cited by examiner

Primary Examiner—Carl Whitehead, Jr.
Assistant Examiner—Christy Novacek
(74) Attorney, Agent, or Firm—Peter F. Corless; Steven M. Jensen; Edwards & Angell, LLP

(57) ABSTRACT

A method is proposed for forming solder areas over a lead frame through deposition of an oxidation layer rather than selective removal of a polyimide-made solder mask, which allows the fabrication of the lead frame to be carried out in a more cost-effective and advantageous manner. The method allows the fabrication of the lead frame to be carried out through stamping without etching. Moreover, it can make the overall integrated circuit package less easily subjected to cracking and more securely assembled. Still moreover, it can make the overall integrated circuit package less likely to be weakened in structural strength by moisture. This method is therefore more advantageous to use than the prior art.

5 Claims, 1 Drawing Sheet

METHOD OF FORMING SOLDER AREAS OVER A LEAD FRAME

BACKGROUND OF THE INVENTION

1. Field of the Invention

This invention relates to method of fabricating a lead frame, and more particularly, to a method of forming solder areas over a lead frame for use in a lead-frame-based chip scaling package (CSP) through deposition of an oxidation layer rather than selective removal of a polyimide-made solder mask, which allows the fabrication of the lead frame to be carried out in a more cost-effective and advantageous manner.

2. Description of Related Art

A chip-scale package (CSP) is an IC package configuration whose overall size would be only slightly greater than the semiconductor die or dies packed therein. A CSP configuration that is based on a lead frame for die attachment is customarily referred to as a lead-frame-based CSP (customarily abbreviated as L/F-based CSP).

In the fabrication of a CSP lead frame, it is required to define wire-bonding areas and mount solder balls at preselected areas on the CSP lead frame. Conventionally, various methods have been proposed for this purpose, such as the U.S. Pat. No. 5,847,455 entitled "MOLDED LEADFRAME BALL GRID ARRAY" proposed by Manteghi. In this patent, a solder mask is disposed over the bottom of a lead frame so as to form selective solder areas, and then solder balls are attached to the selective solder areas. This patented technology is briefly depicted in the following with reference to FIGS. 1A–1C.

Referring first to FIG. 1A, in the first step, a lead frame 10 is prepared. Next, a solder mask 20 is coated, typically from polyimide, over the entire top surface of the lead frame 10.

Referring further to FIG. 1B, in the next step, a selective exposure-development process is performed on a selected portion of the solder mask 20 where a solder-ball opening is defined (in practice, a plurality of solder-ball openings are defined in the solder mask 20, but for simplification of drawing and description, only one is demonstratively shown in FIG. 1B). Next, an etching process is performed to etch away the exposed and developed portion of the solder mask 20, with the left-behind void portion serving as a solder-ball opening 21.

Referring next to FIG. 1C, in the subsequent step, a Pd/Ni (palladium/nickel) layer 30 is formed over the lead frame area confined by the solder-ball opening 21 to a thickness below the top surface of the solder mask 20. This makes the lead frame area where the Pd/Ni layer 30 is deposited become a solder area on the lead frame 10.

The subsequent steps to finish the fabrication of the CSP lead frame includes dry-film lamination, selective exposure and development of the dry film, and etching of the exposed and developed portions of the dry film to define copper lead traces on the lead frame.

The foregoing conventional method, however, has the following drawbacks.

First, it involves the use of etching process and would be unsuitable to employ stamping process in the fabrication, which would make the overall manufacture process more complex and thus costly to implement. Stamping process is unsuitable to employ because it would easily cause the solder mask 20 to be subjected to cracking and uneven coating.

Second, the solder mask 20 is still considered relatively weak in chemical bonding strength with the lead frame 10, so that the overall CSP configuration is considered not highly securely assembled.

Third, the solder mask 20 is relatively high in moisture absorbability, which would make the CSP configuration more likely to be weakened in structural strength by moisture

SUMMARY OF THE INVENTION

It is therefore an objective of this invention to provide a method of forming solder areas over a lead frame, which allows the fabrication of the lead frame to be carried out through stamping rather than etching so as to reduce manufacture cost.

It is another objective of this invention to provide a method of forming solder areas over a lead frame, which would allow the overall integrated circuit package to be more securely assembled.

It is still another objective of this invention to provide a method of forming solder areas over a lead frame, which can make the integrated circuit package less likely to be weakened in structural strength by moisture.

In accordance with the foregoing and other objectives, the invention proposes a new method for forming solder areas over a lead frame.

The method of the invention includes the following procedural steps: (1) preparing an electrically-conductive piece; (2) stamping the electrically-conductive piece into a pre-designed lead frame shape; (3) attaching an electrically-insulating covering to a selected portion of the lead frame where a solder-ball opening is defined; (4) depositing an oxidation layer over the uncovered portion of the lead frame that is uncovered by the electrically-insulating covering; (5) removing the electrically-insulating covering, with the left-behind void portion serving as a solder-ball opening in the oxidation layer; and (6) plating an alloy layer over the lead frame area confined by the solder-ball opening in the oxidation layer, with the plated alloy layer serving as the intended solder area.

The foregoing method of the invention is characterized in the use of deposition of an oxidation layer in lieu of selective removal of a polyimide-made solder mask for the defining and forming of solder-ball openings where solder balls are to be formed. Compared to the prior art, the invention has the following advantages. First, the oxidation layer is greater in rigidity than the polyimide-made solder mask, so that it would be less easily subjected to cracking. Second, the oxidation layer is greater in chemical bonding strength with the lead frame than the polyimide-made solder mask, so that it can make the overall CSP configuration more securely assembled. Third, the oxidation layer is lower in moisture-absorbability than the polyimide-made solder mask, so that it can make the overall CSP configuration less likely to be weakened in structural strength by moisture. Overall speaking, the method of the invention is more advantageous to use than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

FIGS. 2A–2D are schematic sectional diagrams used to depict the method of the invention for forming a solder area over a CSP lead frame.

Figure 1A:
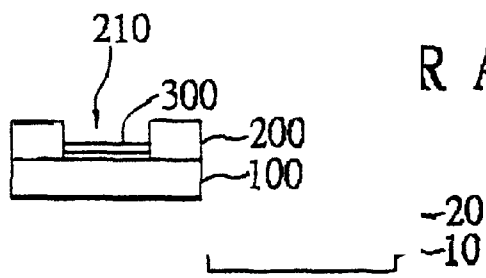
FIGS. 1A–1C (PRIOR ART) are schematic sectional diagram used to depict a conventional method for forming solder areas over a CSP lead frame.
Figure 1B:
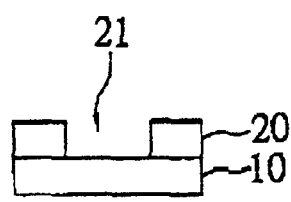
Figure 1C:
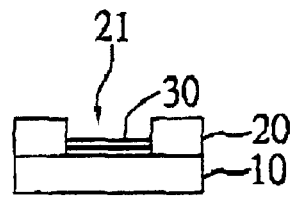
Figure 2A:
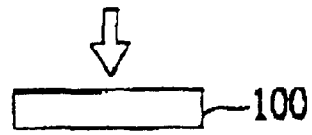
FIGS. 2A–2D are schematic sectional diagrams used to depict the method of the invention for forming solder areas over a CSP lead frame.

Referring first to FIG. 2A, in the first step, a lead frame 100 is prepared by stamping an electrically-conductive piece into a predesigned shape.

Figure 2B:
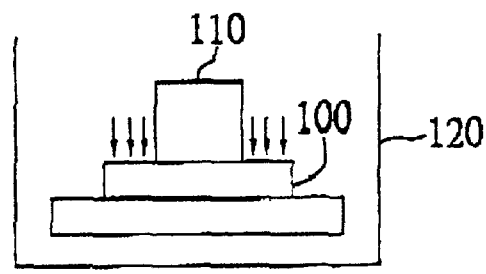
Figure 2C:
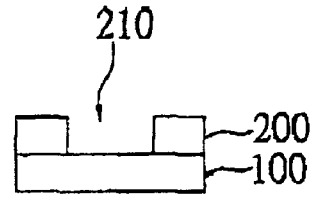
Figure 2D:
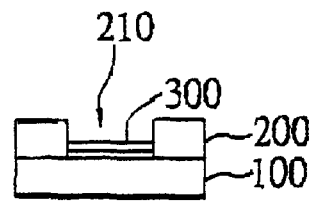

Referring further to FIG. 2B, in the next step, the stamped lead frame 100 is covered with an electrically-insulative covering 110 at preselected areas of the lead frame 100 where solder-ball openings and wire-bonding areas are defined (in practice, a plurality of solder-ball openings are to be defined, but for simplification of drawing and description, only one is demonstratively shown in FIGS. 2B–2D). Next, the entire lead frame 100 together with the electrically-insulative covering 110 are placed in a plating tank 120 where an oxide-deposition process is performed to deposit an oxide, such as brown oxide of copper or black oxide of copper, over the uncovered areas of the lead frame 100 that are uncovered by the electrically-insulative covering 110 (the deposition is indicated by the downward-going arrows in FIG. 2B).

Referring next to FIG. 2C, as a result of the forgoing oxide-deposition process, an oxidation layer 200 is formed over the lead frame 100, preferably to a thickness of below 5 μm (micrometer). This thickness can be precisely controlled through parameter adjustment during the oxide-deposition process. After this, the electrically-insulative covering 110 is removed, with the left-behind void portion serving as a solder-ball opening 210.

Referring next to FIG. 2D, in the next step, a Pd/Ni (palladium/nickel) layer 300 is plated over the lead frame area confined by the solder-ball opening 210 to a thickness below the top surface of the oxidation layer 200. This makes the lead frame area where the Pd/Ni layer 300 is deposited become a solder area on the lead frame 100.

The subsequent steps to finish the fabrication of the CSP lead frame are all conventional steps which are not within the spirit and scope of the invention, so description thereof will not be further detailed.

In conclusion, the invention proposes a new method for forming solder areas over a CSP lead frame, which is characterized in the forming of an oxidation layer in lieu of the conventional polyimide-made solder mask for the defining and forming of solder-ball openings where solder balls are to be formed.

Compared to the prior art, the invention has the following advantages.

First, the oxidation layer is greater in rigidity than the polyimide-made solder mask, so that it would be less easily subjected to cracking.

Second, the oxidation layer is greater in chemical bonding strength with the lead frame than the polyimide-made solder mask, so that it can make the overall CSP configuration more securely assembled than the prior art.

Third, the oxidation layer is lower in moisture-absorbability than the polyimide-made solder mask, so that it can make the overall CSP configuration less likely to be weakened in structural strength by moisture than the prior art. Overall speaking, the invention is more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for forming a solder area over a lead frame, comprising the steps of:
   (1) preparing an electrically-conductive piece;
   (2) stamping the electrically-conductive piece into a predesigned lead frame shape;
   (3) attaching an electrically-insulating covering to a selected portion of the lead frame where a solder-ball opening is defined;
   (4) depositing an oxidation layer formed from brown copper oxide or black copper oxide over the uncovered portion of the lead frame that is uncovered by the electrically-insulating covering;
   (5) removing the electrically-insulating covering, with the left-behind void portion serving as a solder-ball opening in the oxidation layer; and
   (6) plating an alloy layer over the lead frame area confined by the solder-ball opening in the oxidation layer, with the plated alloy layer serving as the intended solder area.

2. The method of claim 1, wherein the oxidation layer is formed to a thickness of less than 5 μm.

3. The method of claim 1, wherein the alloy layer is formed from Pd/Ni.

4. A method for forming a solder area over a lead frame, comprising the steps of:
   (1) preparing an electrically-conductive piece;
   (2) stamping the electrically-conductive piece into a predesigned lead frame shape;
   (3) forming an electrically-insulating covering at a selected portion of the lead frame where a solder-ball opening is defined;
   (4) depositing an oxidation layer formed from brown copper oxide or black copper oxide over the uncovered portion of the lead frame that is uncovered by the electrically-insulating covering;
   (5) removing the electrically-insulating covering, with the left-behind void portion serving as a solder-ball opening in the oxidation layer; and
   (6) plating a Pd/Ni layer over the lead frame area confined by the solder-ball opening in the oxidation layer, with the plated Pd/Ni layer serving as the intended solder area.

5. The method of claim 4, wherein the oxidation layer is formed to a thickness of less than 5 μm.

* * * * *